(12) United States Patent
Woo

(10) Patent No.: US 7,015,149 B2
(45) Date of Patent: Mar. 21, 2006

(54) SIMPLIFIED DUAL DAMASCENE PROCESS

(75) Inventor: Been Jon Woo, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 10/968,103

(22) Filed: Oct. 20, 2004

(65) Prior Publication Data
US 2005/0090100 A1    Apr. 28, 2005

(30) Foreign Application Priority Data
Oct. 24, 2003  (CN) ..................... 2003101081192 A

(51) Int. Cl.
*H01L 21/302*    (2006.01)
(52) U.S. Cl. ..................... 438/738; 438/618; 438/623; 438/734; 438/735; 438/737
(58) Field of Classification Search ................ 438/618, 438/623, 734, 735, 737, 738
See application file for complete search history.

(56) References Cited

U.S. PATENT DOCUMENTS

| | | | |
|---|---|---|---|
| 6,066,569 A * | 5/2000 | Tobben ....................... | 438/717 |
| 6,174,596 B1 * | 1/2001 | Lee ........................... | 428/304.4 |
| 6,514,860 B1 * | 2/2003 | Okada et al. ............... | 438/687 |
| 6,812,131 B1 * | 11/2004 | Kennedy et al. ............ | 438/623 |

* cited by examiner

*Primary Examiner*—Bradley K. Smith
*Assistant Examiner*—Douglas Menz
(74) *Attorney, Agent, or Firm*—Rosenberg, Klein & Lee

(57) ABSTRACT

A simplified dual damascene process is disclosed. In the dual damascene process, a semiconductor substrate with MOS devices having a first metal layer, an etch stopping layer, and a dielectric layer in sequence are formed thereon. A via is formed on the dielectric layer by lithography. An organic layer is then formed. A trench is formed on the dielectric layer by the organic layer, thereby forming a dual damascene structure comprised of the trench and the via. The present invention is directed to a simplified dual damascene process, which can obtain a better trench profile without increasing the dielectric constant of the inter-metal dielectric (IMD).

12 Claims, 10 Drawing Sheets

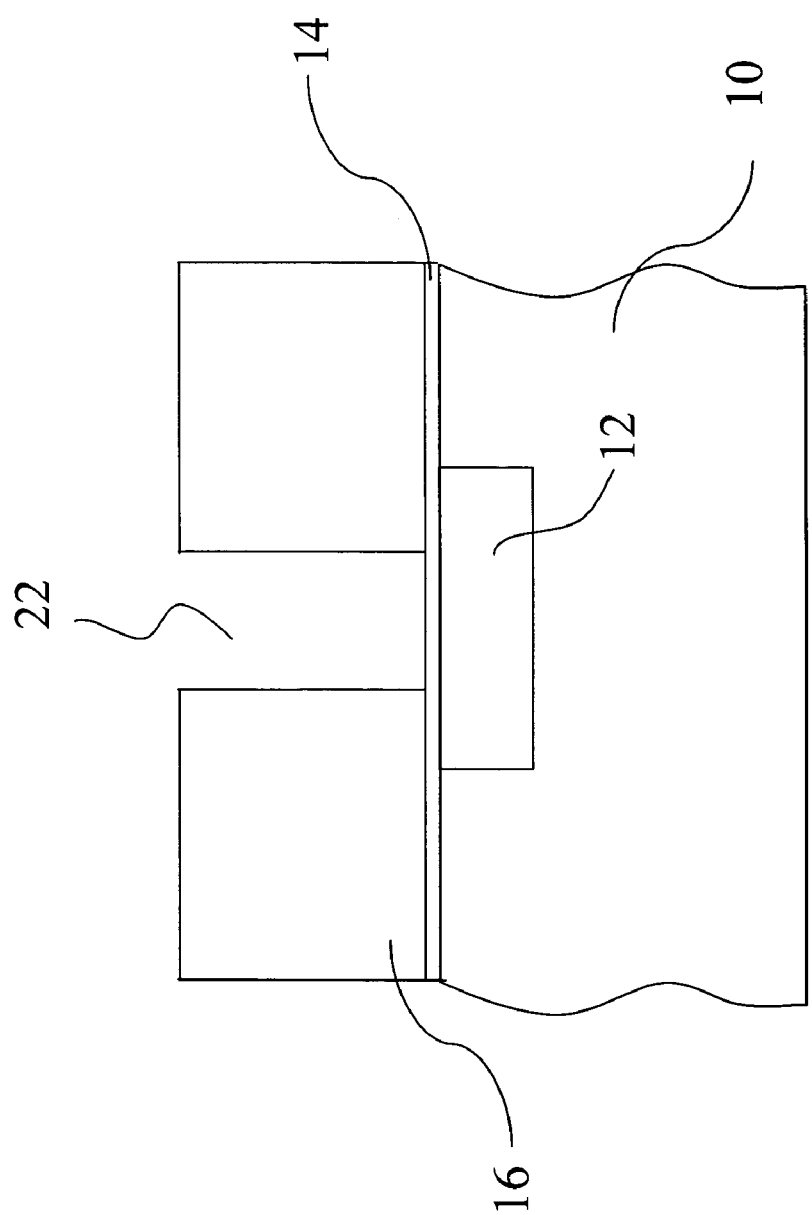

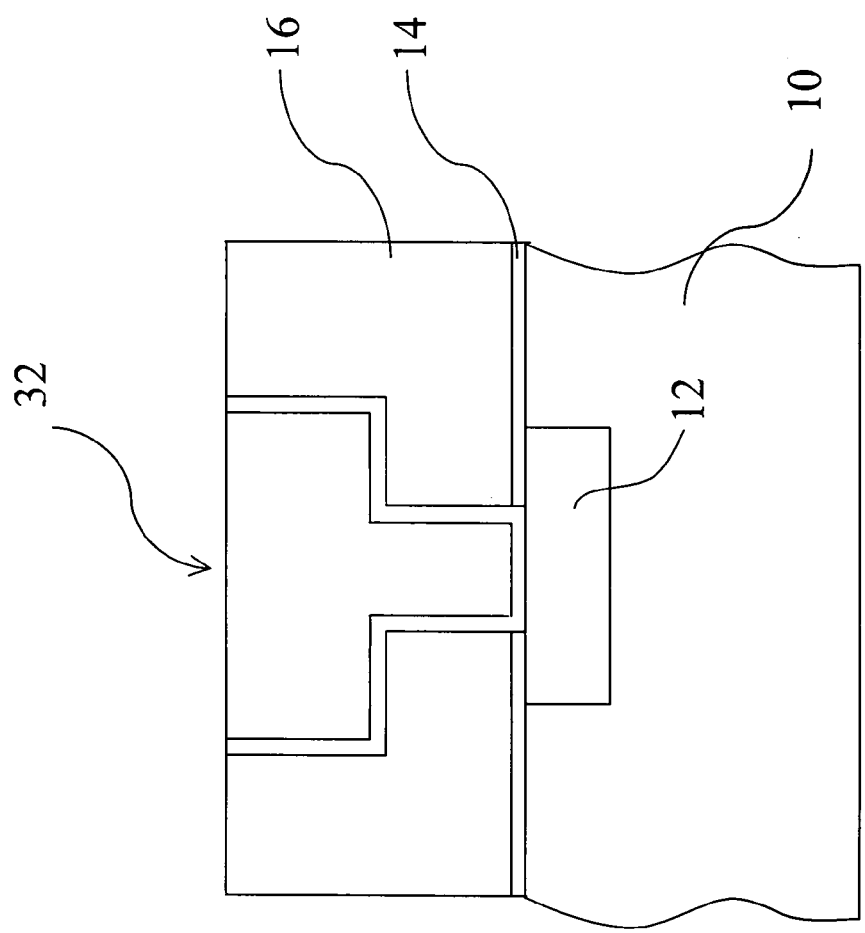

US 7,015,149 B2

SIMPLIFIED DUAL DAMASCENE PROCESS

BACKGROUND OF THE INVENTION

1. Field of the Invention

The present invention relates to a dual damascene process, in particular, to a simplified dual damascene process, in which the steps of stacking the dielectric layer, the etch stop layer, and the stack dielectric layer in the conventional process are omitted and the dielectric constant of the inter-metal dielectric (IMD) is reduced, thereby obtaining a simplified dual damascene process with good trench profile.

2. Description of the Prior Art

As the lines of IC design in semiconductor processing become more and more highly concentrated, the unit area bears a larger and larger current. Since copper has both a low resistance and a high anti-electromigration resistance ability, conventional aluminum interconnect processing is substituted with copper interconnect processing.

When copper is used as the material of the interconnects, the step of patterning the copper interconnects is not easily performed using the current etching technology because the steam pressure of a halide of copper is not high enough. Therefore, a dual damascene process is used to finish both the copper interconnect and the copper plug.

The main advantage of the dual damascene process is that it can be used for etching and filling the conductive metal. There are two method of fabricating the trench having the dual damascene structure. Refer to FIG. 1 which is a cross-sectional diagram of a first dual damascene process according to the prior art. When etching the via 44 of the lower dielectric layer 38 and the trench 46 of dielectric layer 42, a SiN layer is used as a first etch stopping layer 40. The inter-metal dielectric (IMD) with a high dielectric constant (k) used, becomes one problem for using SiN as a first etch stopping layer 40. Also, the capacitance of the dielectric layer increases, resulting in poor isolation of the dielectric layer.

Another dual damascene process of the prior art is shown in FIG. 2. When the trench 46 and the via 44 are etched without using any etch stop layer, it is difficult to control the trench profile and the deepness.

Therefore, the present invention provides a simplified dual damascene process, which reduces the dielectric constant of the inter-metal dielectric (IMD) and shortens the processing time of the dual damascene process and furthermore obtains a better trench profile.

SUMMARY OF THE INVENTION

The present invention provides a simplified dual damascene process, in which the steps of the dielectric layer, the etch stop layer, and the stack dielectric layer in the conventional process are omitted.

Additionally, the structure has a low dielectric constant intermetal dielectric (IMD) with a good trench profile.

The present invention also provides a simplified dual damascene process, which requires less processing time And has a low capacitance dielectric layer.

These objects are accomplished by providing a semiconductor substrate with MOS devices having a first metal layer, an etch stop layer, and a dielectric layer in sequence formed thereon. A first patterned photoresist layer is formed on the dielectric layer. The dielectric layer is etched using the first patterned photoresist layer as a mask to form a via. The first patterned photoresist layer is then removed. An organic layer is formed on the dielectric layer to fill the via. A second patterned photoresist layer is formed on the organic layer to define the size of trench in the organic layer and dielectric layer. The size of the trench is larger than of via. Using the second patterned photoresist layer as a mask, the exposed organic layer is over-etched by using the high selective ratio of the organic layer versus dielectric layer until the surface of the organic layer is less than the dielectric layer. Using the second patterned photoresist layer as a mask, the trench of the dielectric layer is continuously etched until the surface of the dielectric layer is less than organic layer. The second patterned photoresist layer and the remaining organic layer are removed to form a dual damascene process.

These and other objectives of the present invention will become obvious to those of ordinary skill in the art after reading the following detailed description of the preferred embodiment.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 3a through 3h are sectional diagrams illustrating the structure of each step according to an embodiment of the present invention.

DETAILED DESCRIPTION OF THE PREFERRED EMBODIMENTS

The present invention provides a simplified dual damascene process without the steps of the dielectric layer, the etch stopping layer, and the stack dielectric layer of the conventional process. The structure has an inter-metal dielectric (IMD) with low dielectric constant with a high selective ratio of organic layer versus dielectric layer to form a better trench structure.

Refer to FIGS. 3a through 3h, which are sectional diagrams illustrating the structure of each step according to an embodiment of the present invention.

Figure 1:
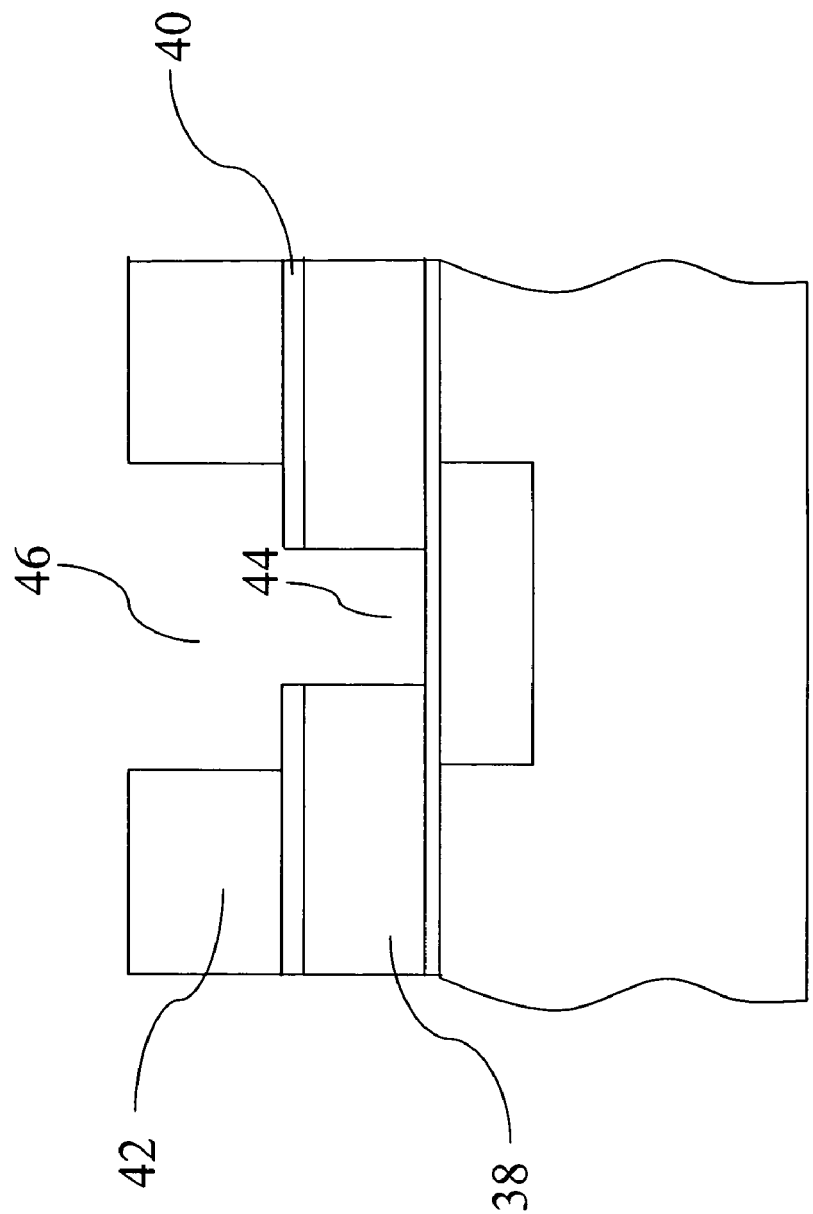
FIGS. 1 and 2 are cross-sectional diagrams of a conventional dual damascene structure.
Figure 2:
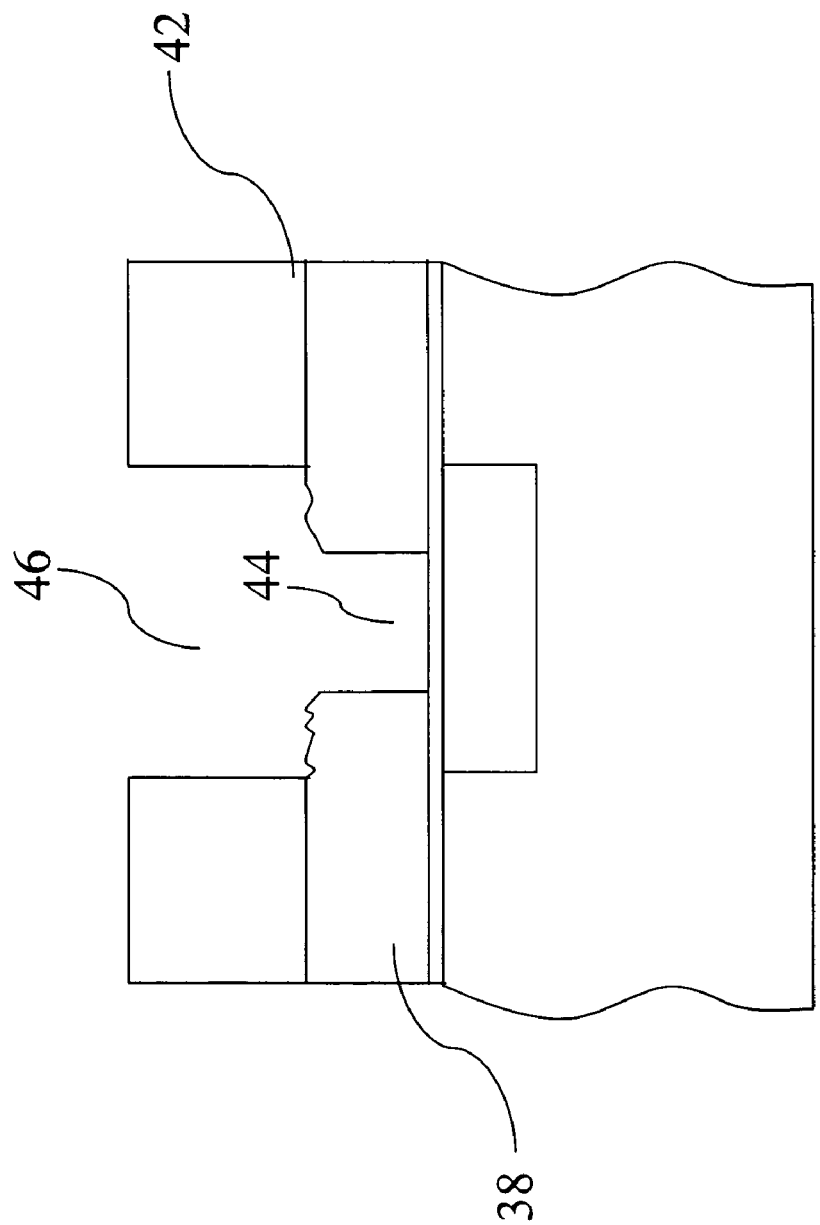
Figure 3A:
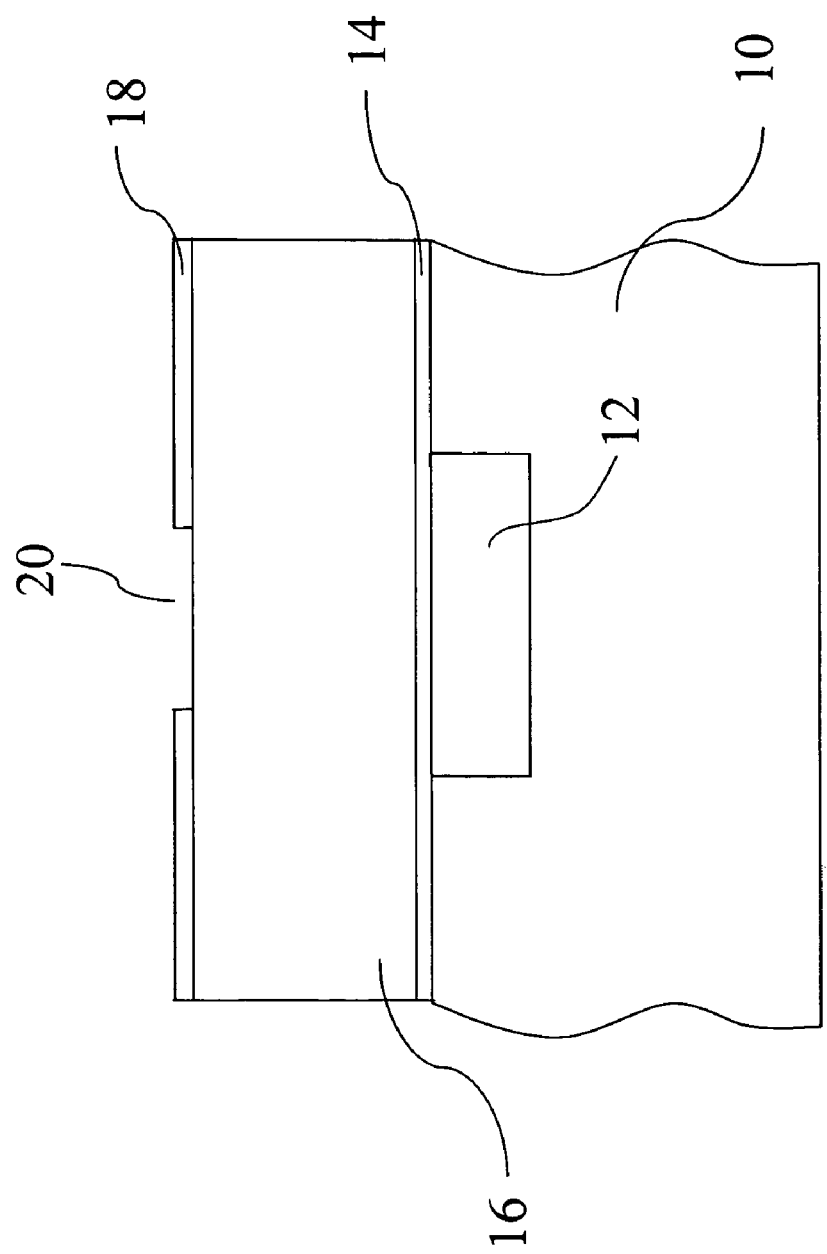

As shown in FIG. 3a, the semiconductor substrate 10 comprises MOS devices formed thereon. A layer of copper, a first metal layer 12, is deposited on the semiconductor substrate 10 by chemical deposition. A nitride stop layer 14 is deposited on the first metal layer 12. A dielectric layer 16 is then deposited on the nitride stop layer 14 using physical vapor deposition (PVD) or chemical vapor deposition (CVD). The material of the dielectric layer 16 is silicon oxide compound or fluorinated silicate glass (FSG).

Next, a photoresist layer is coated on the dielectric layer 16. Photolithography is performed on this photoresist layer to form a first patterned photoresist layer 18. A via contact window 20 is formed on the first patterned photoresist layer 18. The size of the via 22 is defined by the via contact window 20.

Following, the dielectric layer 16 is etched using the first patterned photoresist layer 18 as a mask to form a via 22.

The first patterned photoresist layer 18 is removed, forming the structure as shown in FIG. 3b.

Figure 3C:
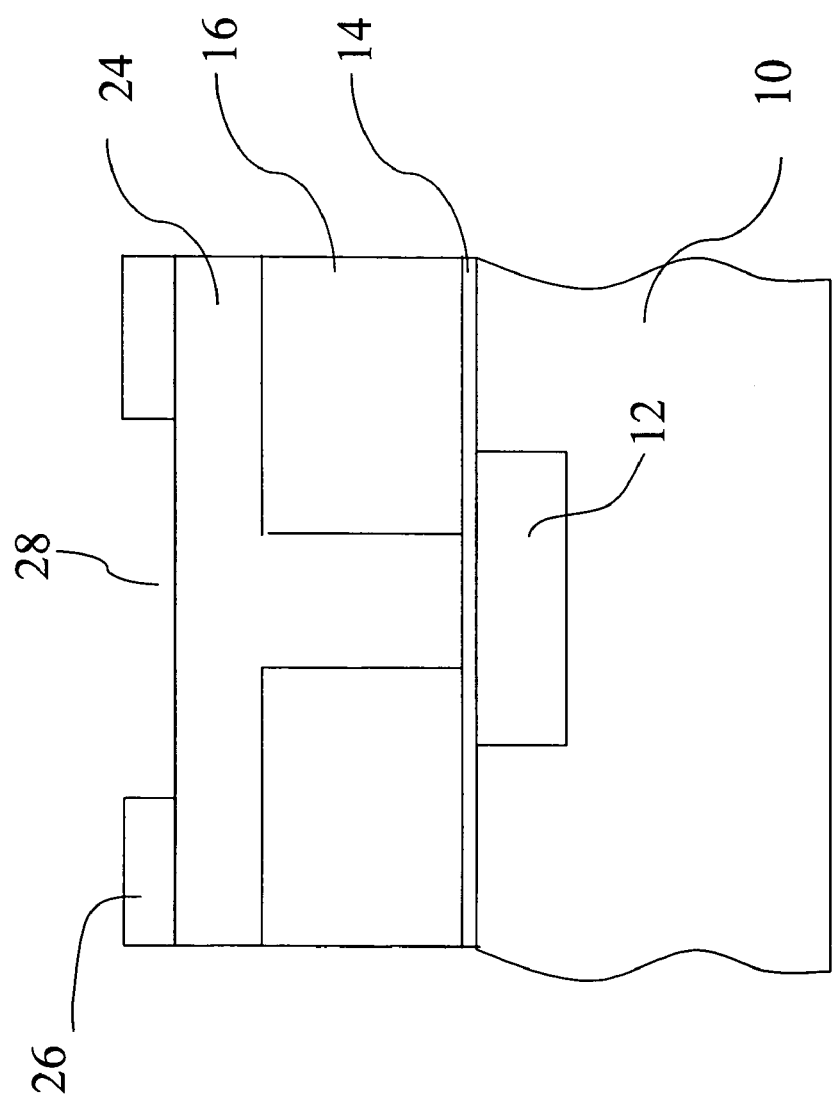

After the first patterned photoresist layer 18 is stripped, as shown in FIG. 3c, an organic bottom anti-reflective coating (BARC) or other organic material for an organic layer 24 is coated on the dielectric layer 16 by spin coating, such that the dielectric layer 16 and the via 22 are filled with the organic layer 24. A second patterned photoresist layer 26 having a trench contact window 28 is formed on the organic layer 24. The trench contact window 28 is larger than the via contact window 20 to define the size of the trench 30 what is in the organic layer 24 and the dielectric layer 16.

Figure 3D:
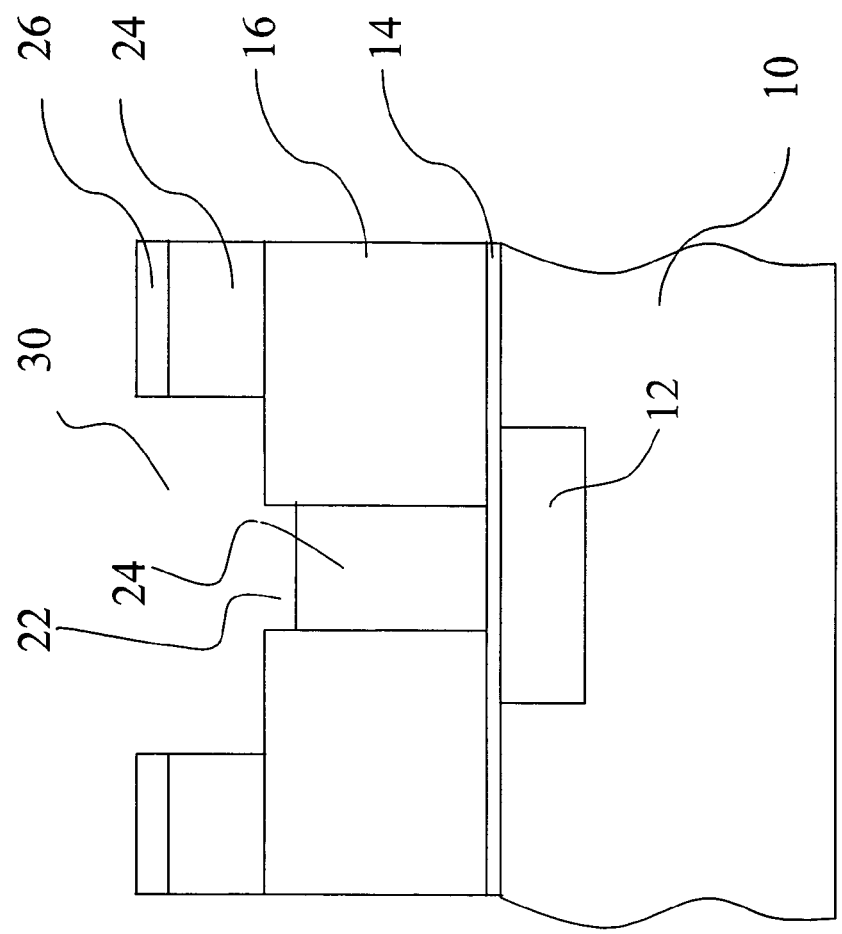

After the second patterned photoresist layer 26 is stripped, the exposed organic layer 24 is over-etched using the second patterned photoresist layer 26 as a mask by a dry etching process with a high ratio of organic layer 24 versus dielectric layer 16, as shown in FIG. 3d, until the surface of the organic layer 24 is lower than the dielectric layer 16, thereby forming the initial profile of the trench structure.

Figure 3E:
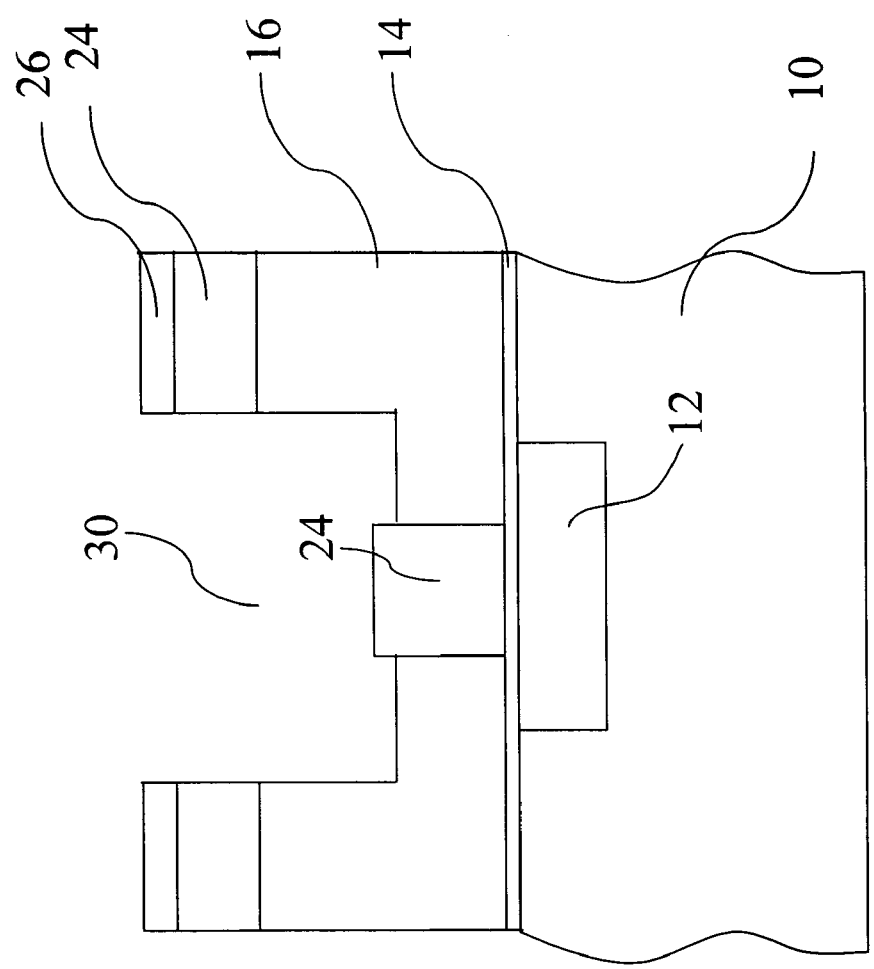

After the organic layer 24 is over-etched, as shown in FIG. 3e, the trench of the dielectric layer 16 is continuously etched using the second patterned photoresist layer 26. The time is used to control the etching depth while the etching rate of dielectric layer 16 is higher than that of the organic layer 24, until the etching depth reaches a point where the surface of dielectric layer 16 is lower than that of the organic layer 24.

Figure 3F:
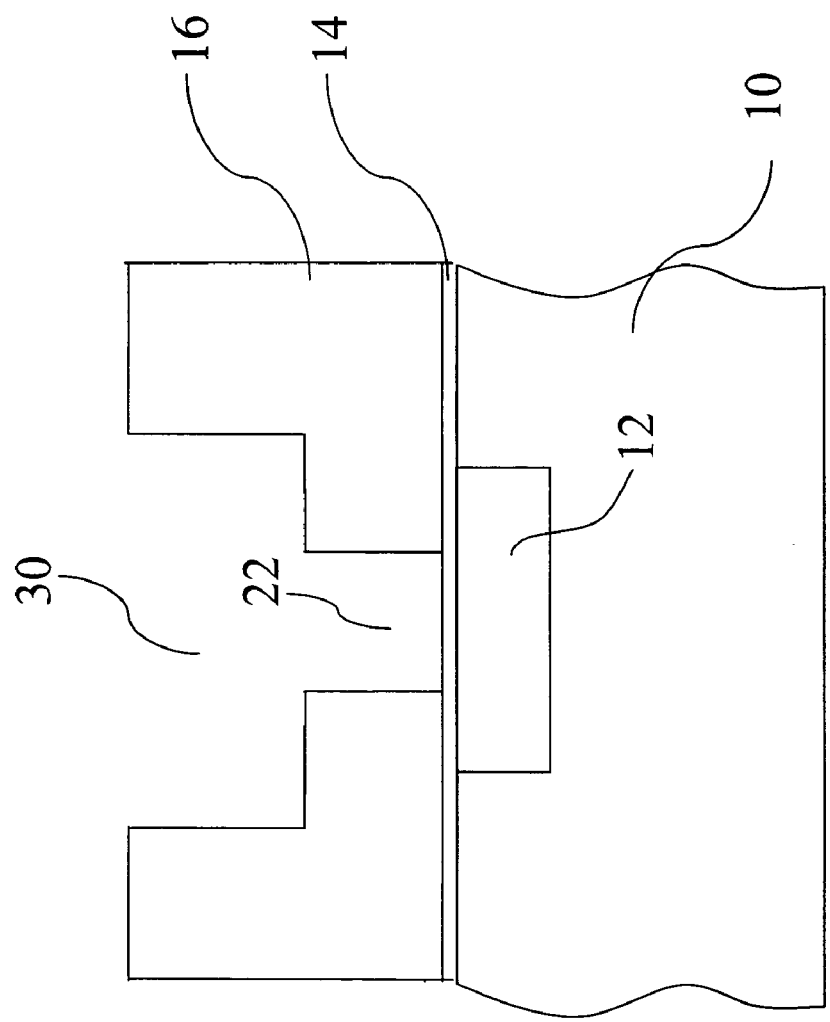

After the trench of the dielectric layer 16 is etched, a trench structure is obtained. The second patterned photoresist layer 26 and the remaining organic layer 24 are stripped by ashing to form the dual damascene structure profile comprised of the trench 30 and the via 22 as shown in FIG. 3f.

Figure 3G:
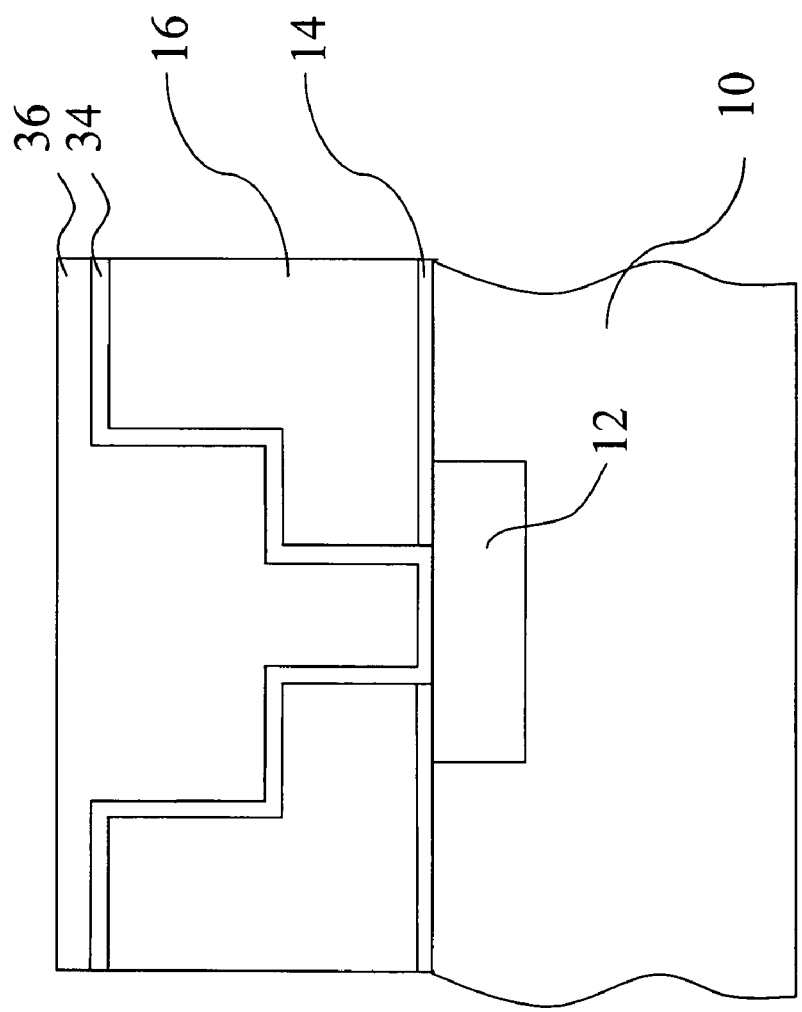

After the dual damascene structure profile is formed, a copper interconnect 32 process is performed. As shown in FIG. 3g, the exposed nitride stop layer 14 is removed, first. Then, a cleaning process is performed on the semiconductor substrate 10. Next, in order to avoid atoms of the second metal layer 36 producing diffusion and punch-through effect on the dielectric layer 16, a barrier layer 34 made of tantalum or tantalum nitride is deposited. A second metal 36 is deposited to form the structure shown in FIG. 3f.

After the second metal layer 36 is deposited, chemical mechanical polishing is performed on the semiconductor substrate 10 to obtain a blanket planarization, forming a good interconnect 32, as shown in FIG. 3h.

According to the present invention, a simplified dual damascene process is provided. An organic layer is formed in a simple coating way. Over-etching is performed using a higher ratio of organic layer versus dielectric layer to form an organic layer filled in the via. The angle between the trench and the via is protected when the trench is etched, in order to obtain a good dual damascene structure.

The present invention has an inter-metal dielectric (IMD) with low dielectric constant without using the etch stop layer, thereby improving the speed and performance of the devices and to obtain a better trench micro-loading effect and bottom profile. Furthermore, the present invention provides a simplified dual damascene process, which requires less processing time.

The embodiment above is only intended to illustrate the present invention; it does not, however, limit the present invention to the specific embodiment. Accordingly, various modifications and changes may be made without departing from the spirit and scope of the present invention as described in the following claims.

What is claimed is:

1. A simplified dual damascene process, comprising:
   providing a semiconductor substrate with MOS devices having a first metal layer, an etch stop layer, and a dielectric layer in sequence formed thereon;
   forming a first patterned photoresist layer on the dielectric layer, forming a via by using the first patterned photoresist layer as a mask, and removing the first patterned photoresist layer;
   forming an organic layer on the dielectric layer to fill the via;
   forming a second patterned photoresist layer on the organic layer to define a size of a trench by etching in the organic layer and the dielectric layer, the trench being larger than the via, using the second patterned photoresist layer as a mask, over-etching an exposed organic layer with a higher selective ratio of organic versus dielectric layer until the surface of the organic layer is lower than the dielectric layer;
   performing a trench etching in the dielectric layer using the second patterned photoresist layer as a mask until the surface of the dielectric layer is lower than the organic layer; and
   removing the second patterned photoresist layer and the remaining organic layer to form a dual damascene structure profile.

2. The simplified dual damascene process of claim 1, wherein the material of the dielectric layer is silicon oxide compound or fluorinated silicate glass (FSG).

3. The simplified dual damascene process of claim 1, wherein the organic layer is an organic bottom anti-reflective coating layer.

4. The simplified dual damascene process of claim 1, wherein the organic layer is deposited on the dielectric layer by spin coating.

5. The simplified dual damascene process of claim 1, wherein the second patterned photoresist layer and the organic layer are stripped by ashing.

6. The simplified dual damascene process of claim 1, wherein the etch stop layer is silicon nitride.

7. The simplified dual damascene process of claim 1, wherein the over-etching is dry etching.

8. The simplified dual damascene process of claim 1, wherein the dielectric layer is formed by physical vapor deposition or chemical vapor deposition.

9. The simplified dual damascene process of claim 1, further comprising an interconnect process, comprising:
   removing the etch stop layer;
   performing a cleaning process on the semiconductor substrate;
   depositing a second metal layer on the semiconductor; and
   performing a planarization process on the second metal layer using chemical mechanical polishing to form a good interconnect.

10. The simplified dual damascene process of claim 9, wherein the material of the second metal is copper.

11. The simplified dual damascene process of claim 9, further comprising depositing a barrier layer before depositing the second metal layer.

12. The simplified dual damascene process of claim 11, wherein the material of the barrier layer is tantalum or tantalum nitride.

* * * * *